United States Patent [19]

Knappenberger

[11] 3,721,746

[45] March 20, 1973

[54] SHIELDING TECHNIQUES FOR R.F. CIRCUITRY

[75] Inventor: Thomas A. Knappenberger, Phoenix, Ariz.

[73] Assignee: Motorola Inc., Franklin Park, Ill.

[22] Filed: Oct. 1, 1971

[21] Appl. No.: 185,552

[52] U.S. Cl. ....174/35 MS, 174/52 R, 220/4 R, 220/23.4, 317/101.2

[51] Int. Cl. ....H05k 9/00

[58] Field of Search ....174/35 R, 35 MS, 50, 52 R; 220/4 R, 23.2, 23.4, 20; 317/101.2; 325/357

[56] References Cited

UNITED STATES PATENTS

| | | | |
|---|---|---|---|
| 3,672,531 | 6/1972 | Balven | 220/4 R |
| 3,524,137 | 8/1970 | Redfield et al. | 317/101 R |
| 3,311,792 | 3/1967 | Scoville | 174/52 R |
| 2,798,781 | 7/1957 | Anderson | 174/52 R |
| 2,777,893 | 1/1957 | Rosso | 174/52 R |
| 2,290,148 | 7/1942 | Amidon | 174/52 R |
| 2,148,449 | 2/1939 | Edwards | 174/52 R |
| 1,897,337 | 2/1933 | Scofield | 174/35 MS |

FOREIGN PATENTS OR APPLICATIONS

| | | | |
|---|---|---|---|
| 1,220,757 | 5/1960 | France | 220/4 R |

*Primary Examiner*—Harold Broome
*Assistant Examiner*—A. T. Grimley
*Attorney*—Foorman L. Mueller et al.

[57] ABSTRACT

A technique for shielding R.F. circuitry is disclosed wherein thin metal strips are formed by chemical etching, and include bend or fold grooves similarly etched, the strips being bent into the desired configuration at the time of assembly. Printed circuit boards with the components all on one side and the connections all on the other are placed in the compartments formed by the bent metal strips. Tabs are provided between the edges of the strips to hold the boards in place. Syntatic foam may be placed in the compartments on the component side and visco-elastic damping foam and or double sided pressure sensitive foam tape is placed between the bottom of the printed circuit board and the bottom shield cover.

Covers also formed by chemical etching are attached to the top and bottom of the compartments and puncture resistant tape may be mounted on the inside of the top and bottom covers.

12 Claims, 24 Drawing Figures

SHIELDING TECHNIQUES FOR R.F. CIRCUITRY

BACKGROUND OF THE INVENTION

This invention relates to shielding techniques, methods and structures for R.F. circuitry, more particularly to shielding techniques, methods and structure which are economical, simple, adaptable and effective over a wide range of circuit configurations and it is an object of the invention to provide improved techniques, methods and structure of this character.

Shielding certain electronic components from one another has always been and still is a problem in R.F. circuitry. As the frequencies have increased, the shielding requirements have become more acute in order to have functioning circuits and to have adequate quality of reception or transmission.

Also, as the operating frequencies have increased, the size of the components has decreased until, at the higher frequencies such as the upper megahertz and the gigahertz range, the components size has become minature, and more and more components have to be shielded from each other and from their connecting circuits. Modular construction, whereby components which together perform the function of a larger circuit, such as the function of a component which may be represented as a single block in a circuit block diagram has evolved into smaller and smaller modules and thus into more and more small completely shielded individual units. This evolution toward miniaturization has, inevitably increased the costs of manufacture, one reason for which was that the individual compartments for each module were made by hollowing out spaces from a solid piece of metal. This was, and is, a tedious time consuming and expensive operation. And when the module was mounted in such a compartment it was difficult if not impossible to repair or replace an individual element of the module without destroying the module. This followed from the encapsulation necessary for shock and vibration protection as well as electrical insulation protection. In the latter constructions printed circuit board techniques have of course been used, wherein the components were mounted on one side of a board and the circuit connections on the other side. However after such encapsulation, the connections and the components were not simultaneously available and to repair or replace an element of the module involved destroying it.

The requirements of equipment for space travel have dictated higher and more rigorous requirements for withstanding shock and vibration conditions.

In all of the foregoing the question of original cost is paramount and the question of ability to repair or replace parts is equally important while at the same time adequate shielding is achieved.

Accordingly, it is a further object of the invention to provide improved techniques, methods and structure which will obviate the disadvantages of the prior art.

It is a further object of the invention to provide an improved economical way to form individual compartmental shields for modular components which will adequately shield against internal as well as external interference.

It is a further object of the invention to provide improved techniques, methods and structure of the nature indicated wherein, the shielding structure is developed at the time of assembly of the circuit into its package.

It is a further object of the invention to utilize the economies of chemical milling or etching in the formation of shields according to the invention.

SUMMARY OF THE INVENTION

In carrying the invention in one form, a method of shielding a combination of components for a high frequency circuit is provided comprising the following steps in combination: laying out the circuit according to modules in which the components do not need to be shielded from each other; forming printed circuit boards in accordance with such layout; mounting the electrical components on the insulation side of the circuit boards; making connections to the terminals of said components to the printed circuits on the circuit side of said boards; forming individual metallic strips, as by chemical milling, for each of said circuit boards having a length determined by the perimetric length of said board; forming upper and lower covers, as by chemical milling, for each of said compartments; forming score lines for bending and locating tabs for such circuit boards on said metallic strips; bending said strips at the score lines to form compartments; bending certain of said locating tabs for form supports for a circuit board; placing a circuit board in said compartment; bending the remaining tabs over the circuit board for holding the circuit board in place; attaching the bottom covers to the edges of said strips adjacent the connection side of the circuit boards; and attaching the top covers to the edges of said strips adjacent the component side of the circuit boards.

In carrying out the invention according to another form there is provided in a method of shielding a combination of components for a high frequency circuit, wherein a circuit is laid out according to modules in which the components do not need to be shielded from each other, printed circuit boards are formed in accordance with such layout, the electrical components are mounted on the insulation side of the circuit board, connections are made to the terminals of said components to the printed circuits on the circuit side of said boards, a method for shielding said modules from each other and from the outside comprising, forming an individual shielding compartment of preformed sheet metal strips at the time of assembly for each module, disposing a circuit module in each compartment against preformed stops in said compartment and forming a component chamber, and a connection chamber at the time of assembly, and providing preformed upper and lower covers for each of said compartments at the time of assembly.

DESCRIPTION OF THE PREFERRED EMBODIMENTS

Figures 1, 1A, 2, 3, 3A:
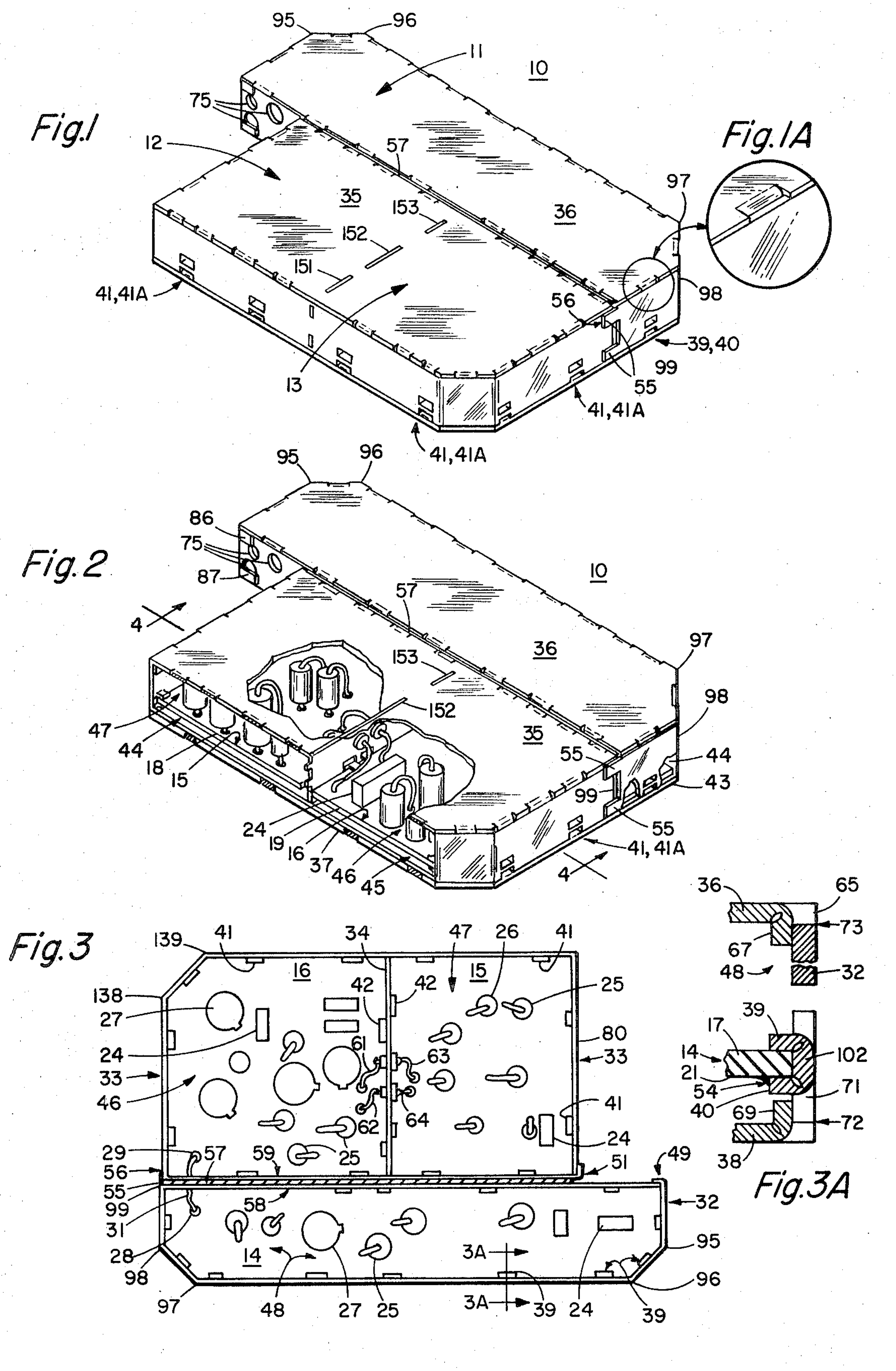
FIG. 1 is a perspective view of a high frequency circuit package including an electrical shield according to the invention.
FIG. 1A is enlarged view of a portion of FIG. 1.
FIG. 2 is a perspective view similar to FIG. 1 with a front portion removed and certain portions broken away for clarity in viewing the interior components.
FIG. 3 is a top plan view with the top covers removed of the structures shown in FIGS. 1 and 2.
FIG. 3A is a sectional view of a larger scale taken substantially in the direction of the arrows 3A—3A of FIG. 3.

Referring to the drawings, the invention is shown in a shielded R.F. circuit 10 comprising three components or modules 11, 12 and 13. The modules 11, 12 and 13 comprise printed circuit boards 14, 15 and 16, respectively, upon each of which a number of circuit components are mounted as may be seen best in FIGS. 2, 3 and 4. The printed circuit boards 14, 15 and 16 may be of any well known variety including electrical insulating boards 17, 18 and 19 with metallic film circuits 21, 22 and 23, respectively, along one side surface thereof, as may be seen best in FIGS. 4 and 9. Typical of the components mounted on the printed circuit boards are ceramic capacitors 24, resistors 25, R.F. chockes 26 and transistors 27. A terminal 28 is shown on board 14 and a terminal 29 is shown on board 16, the two terminals being connected by a conductor 31.

The resistors, capacitors, chokes and the like are all shown in stand-up relationship (form factor) in order that the components may be mounted as close to each other as possible to achieve maximum circuit density. The height of the tallest of the components accordingly determines the height of the overall device and the dimensions of the shielding strips. Since all of the circuit components are mounted on the same side of the respective printed boards and all of the connections are made on the opposite side of those same boards, it will be evident that efficiencies will be achieved in making repairs or replacements of any defective components since the terminals may be unsoldered on the circuit side of the board and the device or component removed from the opposite side. None of the neighboring components are disturbed. Similarly, the shielding effects are efficiently achieved since the components (not requiring relative shielding) are disposed close to each other. That is to say the circuit connections in essence are isolated from the devices and coupling will accordingly not take place therebetween.

The electro-magnetic shields for the circuit boards 14, 15 and 16 consist of metallic strips 32, 33 and 34 which may be made of any suitable metal such for example as beryllium copper which has been solder coated as is well understood in this art. In addition, the shielding means includes top covers 35 and 36 and bottom covers 37 and 38, the top and bottom covers being made for example of the same material as the side strips.

The overall circuit structure and shielding method according to the invention may be described as follows:

The circuit structure consists of individual printed circuit boards of conventional design, such for example, as for each function of the block diagram of a circuit. These circuits are totally enclosed by a sheet metal shield and cover assembly. Shield frames are formed by hand and are keyed and tabbed so that they are self-jigging. Tabs are located on the sides of the shields to capture and mount the printed circuit boards to the frame. Shield tabs are soldered to the printed circuit boards to ground the circuit and to hold the printed circuit boards. Covers are attached by any of several acceptable grounding techniques to the shields from top and bottom to effect a totally enclosed printed board shielded from all interference radiated externally or by adjacent printed circuit boards.

Interconnections between functions of the circuit are made via electro-magnetic interference filters (EMI) or feed through leads depending on conducted interference susceptibility of the circuits.

Shielding pieces are laid out and pre-scored so that forming is done at the time of assembly without special skill tools or fixtures. Using commonly known photochemical etching techniques, shields and covers can be fabricated with etch, score or fold lines at each bend location. Sheets of these shields can be delivered to the assembly area in the flat condition when the shields are left attached to the original sheet stock. This is done by providing attachment tabs in the shield artwork. By grouping sets of shields on a given sheet procurement time, storage area and assembly time are reduced significantly.

By taking into account the form factor of the various electrical components common to R.F. circuitry and standardizing on the mounting of these components, maximum circuit density can be achieved. This is done by positioning all components so that their height above the mounting surface of the printed circuit boards is approximately equal. Following this philosophy with all components the height of the tallest component will control the shield and assembly height.

To ruggedize the assembly for high gravitational force environment a visco-elastic damping foam pad or double sided pressure sensitive foam tape is captivated between the bottom of the printed circuit board and the bottom shield cover. To prevent possible short circuits between the bottom side of the printed circuit and the bottom cover, a puncture-resistant tape such as Mylar is mounted to the inside of the bottom cover. In a like manner the same type of tape is used on the inside of the top cover. To further ruggedize the assembly, the individual circuits may be encapsulated in foam-in place or syntatic foam encapsulants. These encapsulants are selected for ease of removal for repairability purposes.

The technique using pre-scored or etched shields and covers provides at least a ten-fold cost improvement over previous methods of achieving this degree of isolation. The breaking up of the circuit into individual miniature printed circuit boards and mounting to a shield frame allows access to both sides of the printed circuit board. This enhances testing, inspection and repairability. Previous assemblies using machined cavities or nests for circuitry to drop into, which permitted access to only one side of the printed circuit board, or provided point-to-point wiring which is not as repeatable in performance. The described shielding and packaging technique yields higher density circuits because of the greater component volumetric efficiency. Yet the drawbacks of "cordwood" type construction are eliminated so that repair and replacement of components are enhanced. Because of the accessibility for inspection and ease of handling, reliability of the end product is enhanced. Printed circuit boards of the prior art with local shields do not give the required degree of shielding for the applications described herein. Also, according to the invention, since the shields are not an integral part of a next higher assembly housing — for example, like machined cavities would be — the entire assembly can be made to float electrically with respect to ground potential.

The strip 32 includes tabs 39 and 40, the strip 33 includes tabs 41 and 41A and the strip 34 includes tabs 42 and 42A, all to be more particularly described, which hold the printed circuit boards with the components attached thereto and the terminals soldered to the metallic film conductors on the film side of the boards. In this fashion, the boards 14, 15 and 16 are held between the upper and lower edges of the metallic strips to form compartments 43, 44, 45 and 46, 47, 48. The compartments 43, 44 and 45 contain all of the printed circuit connections to the metallic film on the lower surface of the printed circuit board and the compartments 46, 47 and 48 contain all of the components.

The strips 32, 33 and 34 which may be of a suitable thickness for example about two hundredths of an inch, are bent by hand along fold lines and the ends are attached to each other as by soldering as will be more particularly described subsequently in this specification. The ends of strip 32 are attached to each other as by soldering at point 49, the ends of the strip 33 are attached to each other at point 51, for example, and the ends of strip 34 are disposed in suitable slots and soldered to the sides of strip 33 as will be described. After the strips, 32, 33 and 34 have been bent by hand into the shape shown, the lower tabs 40 all around the strip 32 are bent inwardly as may be seen most clearly in FIG. 3A. Similarly, the lower tabs 41A of the strip 33 are bent inwardly and the lower tabs 42A of the strip 34 are bent inwardly analogously to tab 40 of FIG. 3A whereupon is effect a platform is formed interiorly of the shells formed by the bent strips. Thereafter the circuit boards 14, 15 and 16 are dropped into their respective compartments 43–48, 44–47, and 45–46 whereafter the upper tabs 39 of strip 32 are folded downwardly as may be seen most clearly in FIGS. 3A and 4. Similarly the upper tabs 41 of strip 33 and the upper tabs 42 of strip 34 are folded downwardly analogously to tab 39 in FIG. 3A thereby holding the circuit boards 14, 15 and 16 firmly in position between the upper and lower edges of the strips. As has been indicated the R.F. components have previously been mounted on the circuit boards and thus the components stand upwardly in the compartments 46, 47 and 48 and the leads, that is terminals of the components, extend through the circuit board and are soldered, for example, to the metal film strips previously etched into the proper circuitry. After the circuit boards 14, 15 and 16 are contained within the assembled strips as described, the tabs 40, 41A and 42A may be soldered as at 54 (FIGS. 3A and 4), the terminals of the R.F. components having been soldered to the film circuit as at 52 and 53.

After the modular pieces, formed respectively by the bent strips 32, 33 and 34, have been completed, the coordinated whole unit is formed by attaching the modular pieces of strip 32 to the modular piece of strip 33 by means of tabs 55 extending from strip 32 which are soldered to the modular piece formed by strip 33 as at 56. Thereafter a piece of double sided pressure sensitive foam tape or doubled sided Mylar tape for example designated by the reference character 57 is disposed between the adjacent walls 58 and 59 of the compartments 46–47 and 48. The double wall construction formed walls 58 and 59 gives a double shielding effect as may be desirable in some circuit configurations. For many, if not most constructions, of the nature being described the single wall thickness of the modules is sufficient for shielding the components interiorly of the modules from the outside world and vice versa. The pressure sensitive insulating material 57 serves effectively to hold the modules together and at the same time, the soldered connection of the tabs 55 at 56 provides a common ground connection formed by the metal strips. The lower tabs 40, 41A and 42A being soldered to the metallic film as at 54, already described, forms a common ground for the printed circuit boards as may be desirable or necessary.

After the modules 11, 12 and 13 have been completed as described and assembled together to form the coordinated whole, if circuit interconnections between the compartments are necessary they may be achieved by running the feed-through wires or conductors 31 through the walls 58 and 59 as shown in FIG. 3. Similarly, connections between the compartments 46 and 47 may be achieved by the conductors 61 and 62 attached to EMI filters, for example, in strip 34 and thence by conductors 63 and 64 to appropriate terminals on circuit board 15. Whether feed-through conductors or the EMI filters are used depends upon the requirements of the particular circuit.

Referring to FIG. 3, it will be evident that the components in module 11 (compartment 48) and the components in modules 12 and 13 (compartments 47 and 46 respectively) are shielded from the outside world except for top and bottom covers which will now be generally described.

The covers 35 and 36 for the tops of the compartments 46, 47 and 48, and the covers 37 and 38 for the bottoms of the compartments 45, 44 and 43 may be formed of sheet metal having the same thickness and characteristics as that of the sidewalls. In the particular form of shielding arrangement described, one cover 35 applies to both compartments 46 and 47 and similarly the bottom cover 37 applies to compartments 44 and 45. Individual covers may of course be used if desired. The covers are shaped to conform to the outline of the modules or compartments and the exterior edge, for example, edge 65 extends to the exterior of the strip 33 in order that there will be no gap between the metal surfaces when the structure is finally assembled. In addition, each of the covers includes tabs for example tabs 66 on cover 35, tabs 67 on cover 36, tabs 68 on cover 37 and tabs 69 on cover 38 (FIG. 3A). The covers 35 and 37 are mirror images of each other and the covers 36 and 38 are mirror images of each other in order that they may be formed by similar methods as will be described. The tabs 66, 67, 68 and 69 are bent inwardly, downwardly in the case of the top covers and upwardly in the case of the bottom covers. This enables the folded-in tabs to act as guides and thus they abut the interior surface of the strip against which the tabs bear in the assembled condition. In addition, the tabs 68 and 69 on the bottom covers 37 and 38 are disposed at the points where the gaps formed by the board attaching tabs 40 and 41A exist. As may be seen clearest in FIG. 3A, the bending in of the lower tab 69 thus, at least partially, blocks the opening 71 formed by bending up the tab 40. In this way the opening 71 and all similar openings are effectively closed and the interior of the compartments 43, 44 and 45 are shielded from the outside world. That is to say radiation existing inside the compartment will remain there and radiation existing outside will remain outside.

At the junctures 72 and 73 between the covers and the sidewalls solder may be applied in order to completely seal the interior compartments from the outside. For similar purposes metallic tape 70 (FIG. 13D) may be adhesively applied.

Holes 74 exist in the end wall 80 of strip 33 and holes 75 exist in the sidewall 58 of strip 32 for conductors which for example may be coaxial cables coming to the outside from the R.F. components on the inside.

Figure 4:
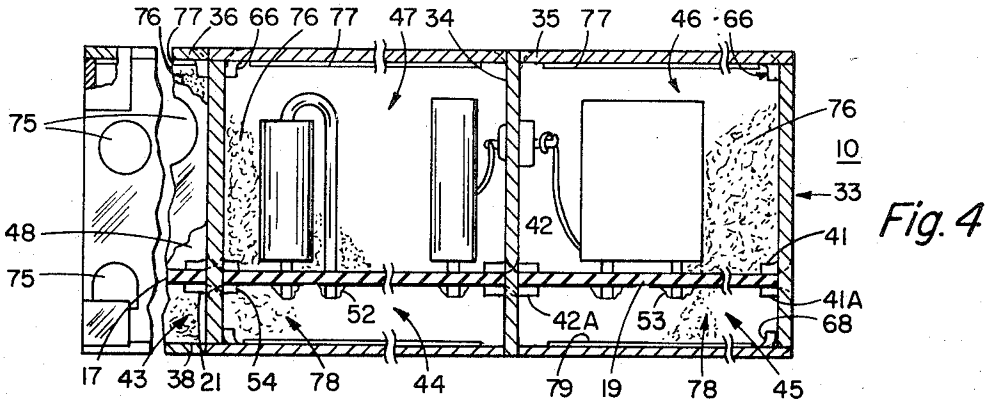
FIG. 4 is a sectional view on a larger scale taken substantially in the direction of the arrows 4—4 of FIG 2.

Referring to FIG. 4, there is shown a foam 76 in place referred to as syntatic foam which, in effect, encapsulates all of the components in the compartments 46 and 47. The foam which, initially, exists in the form of fine particles, may be poured into the compartments and, by a relatively low temperature heating the particles assume a relatively solid form, or foam, but a form such that it may be easily removed around any particular component when it is desired to remove that component. The foam 76 ruggedizes the structure and enables the circuit to withstand high acceleration and vibrational forces, and at the same time, the foam is easily removed for repairability of the components.

Further insulation at the top of the compartments 46, 47 and 48 may be achieved by the application of a pressure sensitive tape 77, such as Mylar for example, on the inside of the covers 35 and 36.

Also for ruggedizing the assembly for high gravitational and vibrational forces, a visco-elastic damping foam pad or double sided pressure sensitive foam tape 78 is disposed in the compartments 44, 45 and 48. The foam damps motion of the printed circuit board existing in these compartments and is readily removable in the event that the terminals are to be unsoldered for removability of the components. In addition, to prevent possible short circuits between the bottom side of the printed circuit, a puncture-resistant tape 79 such as Mylar is attached to the inside of the bottom covers 37 and 38.

One of the principal features of the invention is that the shielding of the R.F. components is achieved to apply to the particular circuit which has previously been laid out with related components adjacent each other. The shielding is achieved by the use of very thin metal pieces or strips which are bent into shape at the time of assembling of the circuit from strips which have previously been formed by any well known means such for example as chemical etching or milling. While this method is preferred according to the invention, it will be evident that at least some strip components can be formed by stamping operations.

Figures 5, 5A, 5B, 5C, 5D, 6, 6A, 6B:
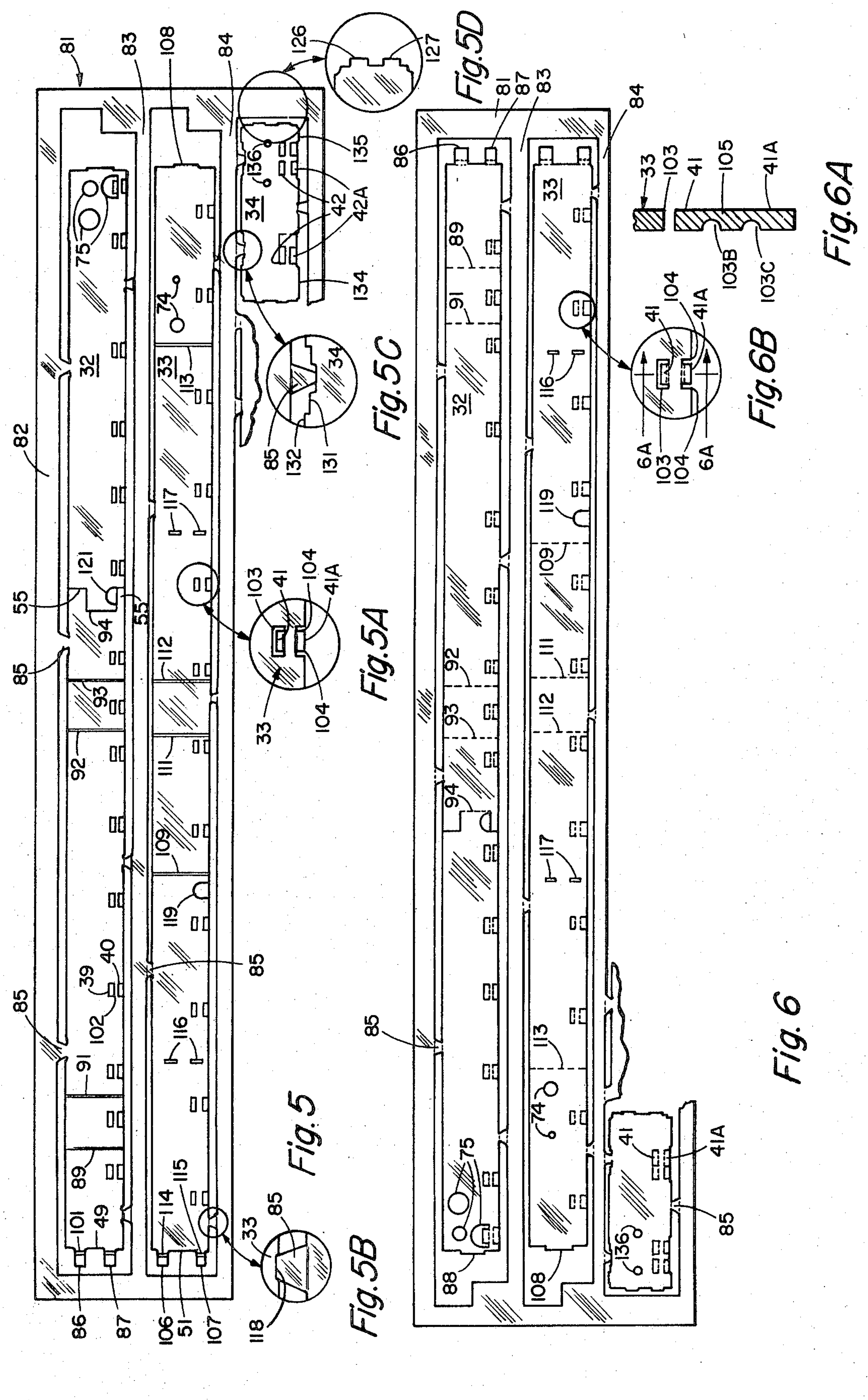
FIG. 5 is a plan view of a laminar piece according to one step in the method of the invention showing the shield forming strips from an interior point of view.
FIG. 5A is an enlarged view of a portion of the structure shown in FIG. 5.
FIG. 5B is an enlarged view of another portion of the structure shown in FIG. 5.
FIG. 5C is an enlarged view of a still further portion of the structure shown in FIG. 5.
FIG. 5D is an enlarged view of yet another portion of the structure shown in FIG. 5.
FIG. 6 is a plan view similar to FIG. 5 of the laminar piece shown in FIG. 5 but from the reverse side thereof.
FIG. 6A is a sectional view on a larger scale taken substantially in the direction of the arrows 6A—6A of FIG. 6.
FIG. 6B is an enlarged view of a portion of the structure shown in FIG. 6.

Referring to FIGS. 5 and 6, and also in connection with FIGS. 1, 2, 3 and 4, it will be understood how the strips 32, 33 and 34 are made and are further described. As may be seen in FIGS. 5 and 6, the strips 32, 33 and 34 are formed from a larger piece or laminar assembly 81. While only these strips are shown included within laminar assembly, 81 it will be clear that more pieces may be formed from one metal sheet in particular circumstances. The strips 32, 33 and 34 are formed by chemical etching, or milling techniques, using photolithographic techniques as is well understood. FIG. 6 represents the same strips as FIG. 5 but in FIG. 6 the strips are viewed as from the outside of the modules whereas the strips of FIG. 5 are viewed as from the inside of the modules. Thus, the strips on FIGS. 5 and 6 are the mirror images of each other.

The strips 32, 33 and 34 are supported inside of a border or edge piece 82, interior supporting strips 83 and 84 running from one end of the lamination to the other. From the edge 82 and the strips 83 and 84 attaching tabs or nibs 85 extend and hold the strips in position until it is desired to remove them from the supporting framework at the assembling of the shielding structure. The space between the strips 32, 33 and 34 and the border 82 and the interior supporting strips 83 and 84 is etched away by the etching solution leaving the strips 32, 33 and 34 suspended in the framework by the attaching nibs 85.

Comparing FIGS. 3 and 5 and 6, the strip 32 begins at 49 with the tabs 86 and 87 and terminates at the other end with a small protruberance 88 which in the finished condition will be received between the inside surface edges of the tabs 86 and 87. Between the tabs 86 and 87 and the protruberance 88 there are a series of etched grooves 89, 91, 92, 93, and 94 located at the bends respectively 95, 96, 97, 98 and 99 (FIGS. 2 and 3). Each of the tabs 86 and 87 also includes an etched groove 101 for bending at the point 49. In comparing FIGS. 5 and 6 from the mirror image standpoint it will be understood that where a corresponding line appears in both views the etchant has eaten all the way through the material leaving spaces, or slots, for example, but where a line appears only on one Figure at the corresponding position, the etchant has etched only part way, for example halfway through the material thereby forming the bend grooves 89–94 for example. Thus from the exterior viewpoint the bend lines are shown dotted in FIG. 6.

In the etching process the upper and lower tabs 39 and 40 are formed with a piece of solid strip material 102 therebetween. The relative size and position of the tabs in the final position of assembly of the structure may be visualized in FIG. 3A. In FIG. 5A, associated with strip 33, an enlargement of the tab structure is shown including the tabs 41 and 41A. The tab 41 is separated from the body of the strip 33 by the etched slot 103 and the tab 41A is separated from the body of strip 33 by a pair of etched slots 104. Each of the pairs of tabs including the tabs 39 and 40 of strip 32 and all of the other similarly shown tabs on this strip and the similarly shown tabs on strip 33 are formed and look in the same way as the tabs 41 and 41A shown in FIG. 5. Between the extremities of slot 103 and the extremities of the pair of slots 104 (FIG. 5A), there is a widened solid line indicating that there is a groove etched into this side of the tabs 41 and 41A. This also applies to all of the similarly formed tabs on strips 32 and 33 as shown in FIG. 5.

Referring to FIG. 6B, there is shown the reverse side of the tabs 41 and 41A as compared with FIG. 5A, although this is an enlargement of a different set of tabs as those shown in FIG. 5 it applies to all sets of tabs on the same strip of material. Thus as may be seen in FIG. 6B, the same slot 103 is shown, and the same pair of slots 104 is shown, indicating that the slots 103 and 104 extend completely through the material of strip 33. However the solid lines between the extremities of the slots 103 and 104 as seen in FIG. 5A are shown dotted in FIG. 6B, indicating that these grooves extend only part way through the material of strip 33, for example halfway through. This may be visualized more clearly by referring to FIG. 6A which is an enlargement of the tabs shown in FIG. 6B. Thus in FIG. 6B the strip 33 includes the slot 103 and the grooves 103B and 103C, the grooves 103B and 103C extending halfway through the body of the material 33. Comparing with FIG. 3A, the tabs 41 and 41A (analogous to tabs 31 and 40) may be bent inwardly utilizing the grooves 103B and 103C as fulcrums or bending corners. The material 105 between grooves 103B and 103C corresponds to the material 102 as shown in FIG. 5 and FIG. 3A. The tabs 41 and 41A as viewed in FIG. 6A, when bent down into the horizontal position will, of course, hold the printed circuit board 15 between them in the same way that tabs 39 and 40 hold the circuit board 14 between them.

The strip 33 which forms the compartments 44, 45, 46 and 47 includes the tabs 106 and 107 at one end and a protuberance 108 at the other as viewed in FIGS. 5 and 6, the protuberance 108 having a length equal to the thickness of the material of the strip and having a width so as to just fit inbetween the tabs 106 and 107. Strip 33 is shown as though viewed from the interior of the compartments and thus shows the bend or fold etched grooves 109, 111, 112 and 113. In addition, the strip 33 includes the etched fold or bend grooves 114 and 115 on tabs 106 and 107, respectively, and includes slots 116 and 117 for a purpose to be described. The strip 33 is held to the frame 81 by a series of nibs 85 as may be seen best in FIG. 5B which is an enlargement of one attaching nib. It will be observed that the nib 85 has a portion 118 which extends inwardly of the edge of strip 33 so that when the strip 33 is broken away there is no burr left to interfere with the straight edge of the strip. The strip 33 also includes openings 74 and 119 for conductors to pass through, as will be described. Similarly, the strip 32 includes holes 75 and 121 for conductors to pass through also as will be described.

In addition to strips 32 and 33, strip 34 is part of the laminar assembly 81, and is held thereto by nibs 15. The strip 34 includes tabs 42 and 42A formed as described for tabs 41, 41A and 39, 40, the tabs 42 and 42A being folded inwardly as may be visualized in FIG. 3 for holding the circuit boards 15 and 16 between them. The right-hand end of strip 34 includes small protuberances 126 and 127 and the left hand end includes similar small protuberances 128 and 129 (FIG. 5D) which will be received respectively in slots 116 and 117 in the assembling process as will be described.

Referring to FIG. 5C, it will be observed that the strip 34 has the attaching nib 85 terminating inwardly of an edge 131 which edge corresponds to the width of strips 32 and 33. The portion 132 of strip 34 is slightly higher than the edge 131 and forms a short protuberance which is received in slots formed in the covers as will be described. In addition to the protuberance 132, strip 34 has protuberances 133, 134 and 135 of the same dimensions as 132 also for reception in slots as will be described. In addition the strip 34 includes holes 136 for conductors 61, 63 and 62, 64.

Before describing the construction of the covers 35, 36, 37 and 38 (FIGS. 7 and 8) further the assembly of the strips 32, 33 and 34 into the compartments 43, 44, 45, 46, 47 and 48 will now be described.

At the time of assembly of the component parts into the coordinated whole, a series of laminar assemblies 81 are supplied to the assembler as are a series of circuit boards 14, 15 and 16 and all of the R.F. components. The steps to be taken in assembling the strips 32, 33 and 34 to each other and to the circuit boards 14, 15 and 16 may be varied on different occasions by different operators, and it is not essential that the steps be followed in the same sequence at all times. The operator takes a laminar assembly 81 and by wiggling the attaching nibs 85 back and forth removes the strips 32, 33 and 34 from the assembly. The strip 32 is then bent along the fold lines 89, 91, 92, 93 and 94 to form the bends or corners 95, 96, 97, 98 and 99. The tabs 86 and 87 are bent at right angles and lie along each side of the small protuberance 88 (FIG. 5) the protuberance 88 projecting onto the edge 49. The tabs 86 and 87 lie adjacent the openings 75 and are soldered to that portion of the strip 32 at that end. At the fold line 94, that is the bend 99, a pair of tabs 55 are formed (FIG. 3).

The strip 33 is then removed from the laminar assembly 81 in a similar manner by the operator bending the nibs 85 back and forth until they have broken away. Thereafter the strip 33 is bent along the fold lines 109, 111, 112 and 113 to form the corners 136, 138, 139 and 141. The tabs 106 and 107 are bent at right angles and are disposed along each side of the protuberance 108 to form the corner 51. The tabs 106 and 107 may be soldered to the strip on each side of the protuberance 108 to form, essentially, the rectangular structure as seen. After the strip 33 has been bent into the rectangular configuration, the slots 116 and 117 therein will be disposed on opposite sides of the rectangle and at this stage the protuberances 126 and 127 of strip 34 which has also been broken away from the laminar assembly are received in the slots 117. The protuberances 126 and 127 in slots 116 are soldered to that surface of the strip 33 and the protuberances 128 and 129 in slots 117 are soldered to that surface of strip 33 for complete shielding. The compartments 44, 45, 46 and 47 comprise the rectangle and may have the side 59 disposed alongside the side 58 as seen in FIG. 3. The tabs 55 are then soldered to the wall of strip 33. The insulating material 57 is then disposed between the sides 58 and 59 and the surfaces are pressed against each other and are held in position by the adhesive forming part of the side of the insulating member.

The outline or shell of the three upper and three lower compartments is now complete and, at this stage, the circuit boards with or without components 14, 15 and 16 may be disposed in position as described by bending in the lower tabs 40, 41A and 42A, placing the boards in place and then bending in the upper tabs 30, 41 and 42. Soldering of the lower tabs to the ground plane of the metal film 21, 22 and 23 on the circuit boards and mounting components to the circuit board if this has not been previously done is then performed to complete the basic construction. The syntatic foam 76 and the visco-elastic damping foam pad 78 and the insulating members 77 and 79 may be placed in position. At this stage the structure is ready for the assembly thereto of the covers and the formation thereof will now be described.

The covers 35, 36, 37 and 38 are formed by chemical milling or etching from a laminar piece 142 through the use of well known photolithographic techniques. The laminar piece or assembly 142 includes an outer supporting frame 143 to which the covers 35 and 36 are attached by appropriate tabs 144. The space between the covers 35 and 36 and the frame 143 is etched away in the chemical process leaving the tabs 144 to support the covers until use thereof is needed. The photolithographic process in forming the covers etches away the material 145 and 146 between the covers and the frame giving the configurations shown and forming the tabs 66, 67 and 144. Each of the tabs 66 and 67 is identical to the other and they are spaced in accordance with the requirements of the particular structure as has already been described.

Figures 7, 7A, 8, 8A:
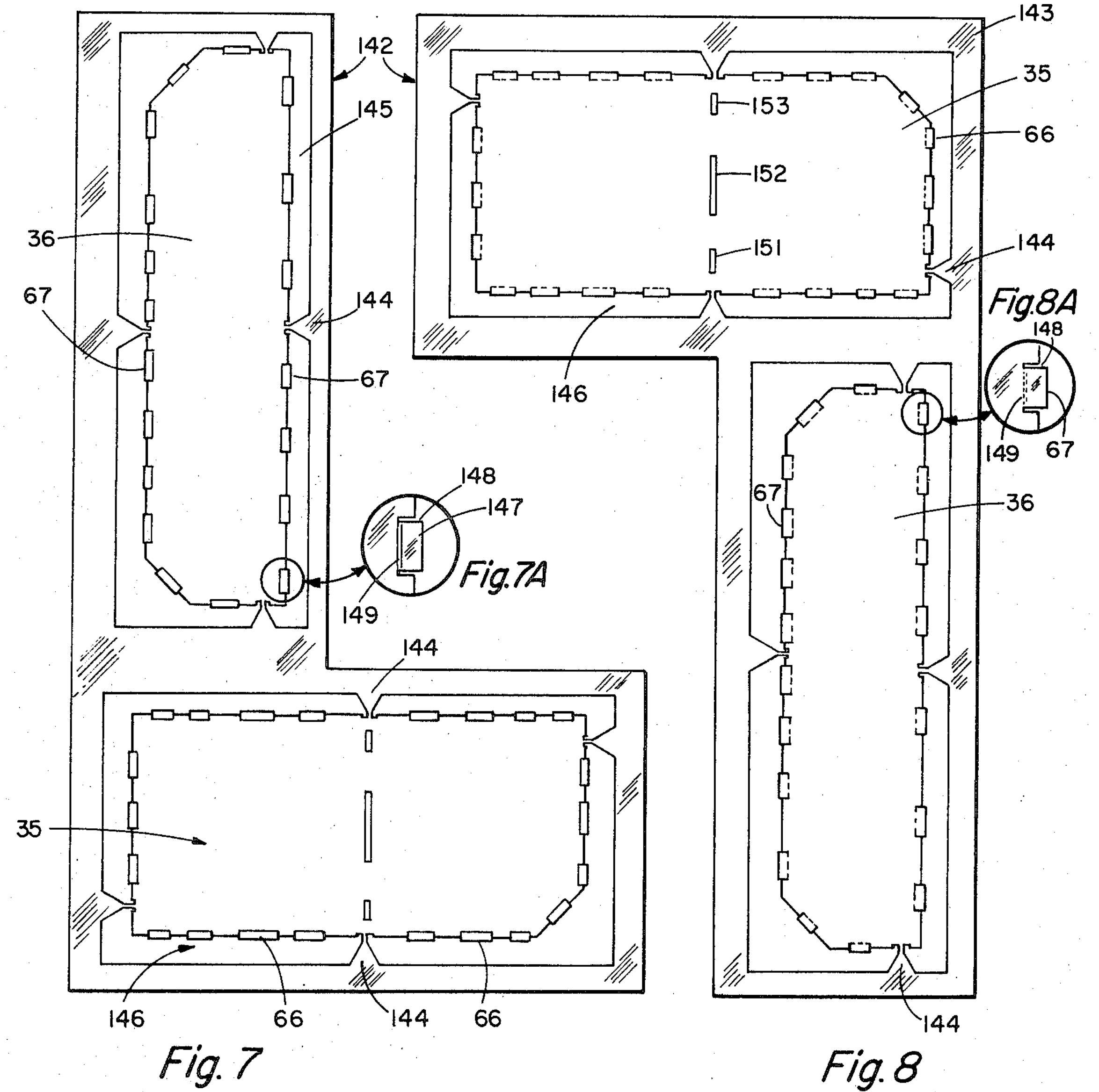
FIG. 7 is a plan view of a laminar piece forming the top and bottom covers according to the invention from an interior point of view.
FIG. 7A is an enlarged view of a portion of the structure shown in FIG. 7.
FIG. 8 is a plan view of the same laminar piece as shown in FIG. 7 but from the exterior point of view.

In FIG. 8, the covers 35 and 36 are viewed from the exterior and it will be observed that the tabs 66 and 67 extend beyond the perimeters of the covers proper. In FIG. 7, the covers 35 and 36 are viewed from the interior and thus it will be noted that the tabs 66 and 67 are separated from the covers proper by slots 148 and by fold grooves 149. The construction of the tabs 66 and 67 is the same for each tab of covers 35 and 36. When the covers are needed for use they are broken away from the framework 143 by the operator bending the tabs 144 back and forth until they are broken. Thereafter the tabs 66 and 67 are bent downwardly and the covers are placed in position as may be visualized in FIG. 3A, the tabs being disposed inwardly of the sidewalls.

As has already been indicated, the top and bottom covers are identical except that they are the mirror images of each other and thus the same photolithographic method and masks may be used to form the bottom covers following which these covers are disposed in place as may be visualized in FIGS. 3A and 4.

In the case of the lower covers, the tabs 69 are disposed opposite the holes left when tabs 40 are folded inwardly in order to prevent radiation from coming out from the compartments as already described. After the upper and lower covers are disposed in place, a continuous solder line may be formed along the entire edge or conductive metal tape may be formed over the entire edge to provide a continuous metallic shield around the radio frequency components inside of the structure. The cover 35 has slots 151, 152 and 153 therein into which are received the protuberances 132 (FIG. 5C) and thereafter solder may be applied to there slots again to form a continuous metallic shield.

Figure 9:
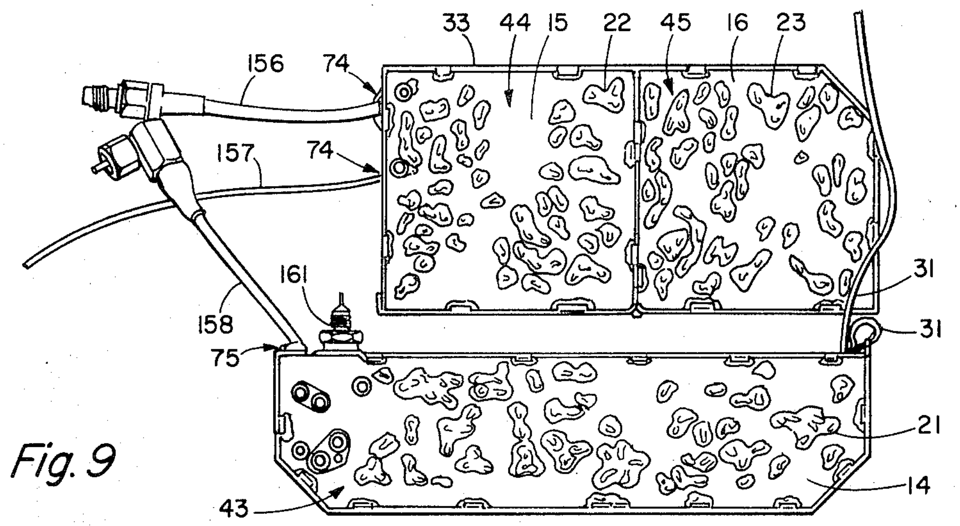
FIG. 9 is a bottom plan view illustrating the shielded components in an advanced state of assembly.
Figure 10:
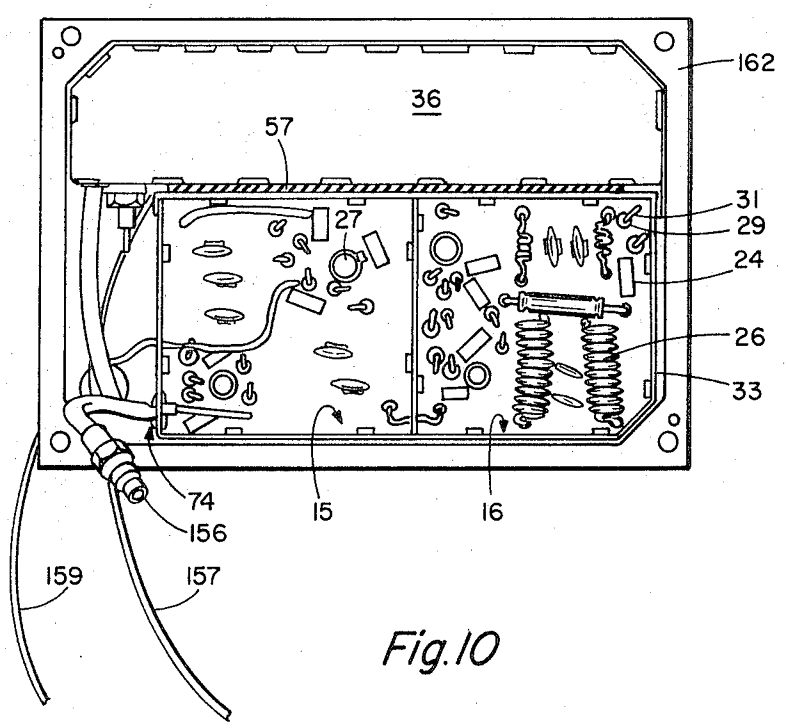
FIG. 10 is a top plan view of the shielded components according to the invention in a still further advanced state of assembly.

Referring to FIG. 9, there is shown the assembled devices in compartments 43, 44 and 45 which include respectively the circuit boards 14, 15 and 16. In this Figure the circuit boards are shown upside down and the islands of metal film 21, 22 and 23 are shown connecting the circuit components which exist on the upper side of the circuit boards. The conductors 31 shown in this view, in the assembled construction, extend through opening 121 from compartment 48 to compartment 46 thus connecting terminals 28 on printed circuit board 14 to terminal 29 on printed circuit board 16. In this Figure the compartments 44 and 45 containing circuit boards 15 and 16 and the compartment 43 containing circuit board 14 are not yet attached to each other as they are as shown in FIGS. 3 and 10. In addition, in FIG. 9, there are shown conductors 156 and 157 which come out of openings 74. Also conductors 158 and 159 and terminal 161 are shown coming out of openings 75.

In FIG. 10, the completed device including the shielding members are mounted inside of a further metallic container 162 which may become part of a larger modular unit. In FIG. 10, the cover 36 is shown in place whereas the cover for the compartments 44 and 45 is shown removed in the interest of showing circuit component arrangement.

Figure 11:
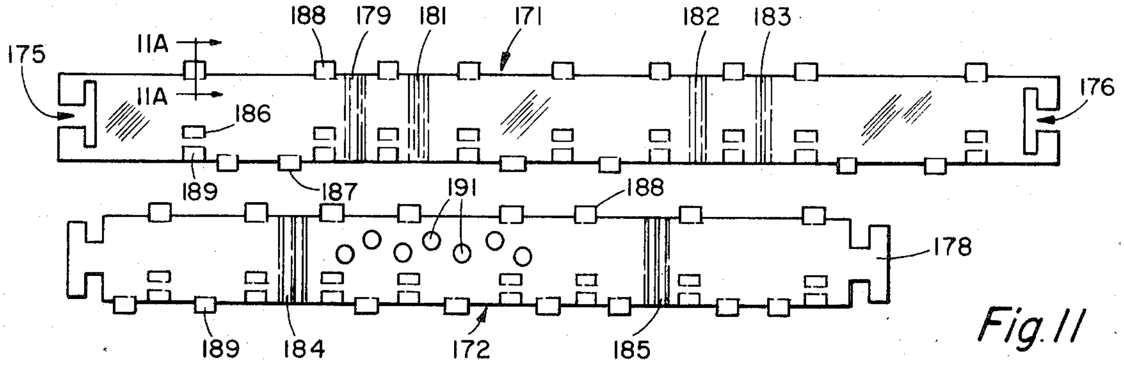
FIG. 11 is an elevational view of a pair of strips of shielding material according to another form of the invention.
Figure 12:
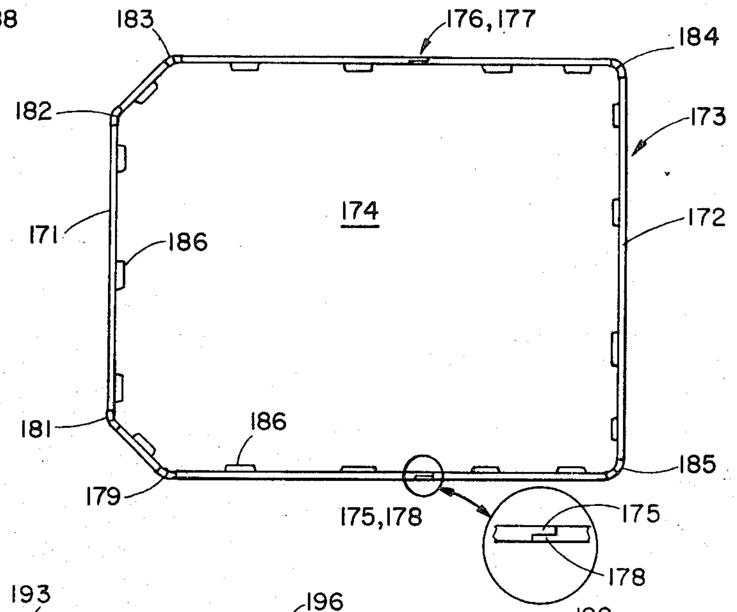
FIG. 12 is a plan view of a shell formed with the strips of FIG. 11.

Referring to FIGS. 11 and 12, there is shown a modified form of the invention. In FIG. 11, there are shown a pair of strips 171 and 172 which are formed by the photolithographic techniques already described and of a material such as beryllium-copper which has been solder coated.

The strips 171 and 172 are hand bent by the operator during the assembling operation to form an essentially rectangular compartment or structure 173. The structure includes a printed circuit board 174 (shown blank) in the interest of clarity inasmuch as the circuit components which may be mounted thereon need not be specifically described, being of the same character as described in connection with the preceding Figures.

Figure 11A:
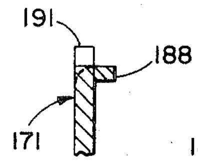
FIG. 11A is a sectional view on a larger scale taken along the lines 11A—11A of FIG. 11 with some modification.

Strip 171 includes a female splice portions 175 and 176 at the respective ends, and strip 172 includes male splice portions 177 and 178 at the respective ends. Strip 171 includes a series of grooves 179, 181, 182 and 183 which grooves extend only partially through for example, halfway through the strip, in order that this strip may be bent at the grooves into corners having radii as compared with 90° or sharp corners. The strip 172 includes a series of grooves 184 and 185 similarly for forming radiused corners as compared with corners having right angles. Similar to the preceding Figures the strips 171 and 172 include upper and lower printed circuit mounting tabs 186 and 187, respectively, which when the strips are first formed by the photolithographic process are tabs within the planes of the strips. But when the strips are assembled to from the completed device, the tabs 186 and 187 are bent inwardly as may be seen in FIG. 12 for holding the printed circuit board 175. In addition the strips 171 and 172 include upper cover mounting tabs 188 and lower cover mounting tabs 189 which are also formed by the photolithographic process as described. Referring to FIG. 11A it will be seen that in the assembled construction the tab 188 is bent downwardly to form a ledge upon which the cover (not shown) will lie in the completed structure. In such a construction the cover is, of course, flush with the upper edge 191 of the strips 171 and 172.

Referring to FIG. 12, the strips 171 and 172 are assembled to form essentially a rectangle. The female splice 175 and the male splice 178 are joined together for one splice and the female splice 176 and the male splice 177 are attached together for the other splice. The fold or bend grooves 179, 181, 182, 183, 184 and 185 are shown in FIG. 12 as forming the corners having the same reference characters. When the strips 171 and 172 are assembled together, the joint 176, 177 and the joint 175, 178 may be soldered as is well known to form the completed periphery.

In addition the strip 178 includes a series of openings or holes 191 through which conductors may be taken from inside of the shielded container to the outside as for example by way of EMI filters.

Thus it will be evident that the technique according to the invention may be utilized to form devices having a single compartment as well as devices having multiple compartments.

Figure 13:
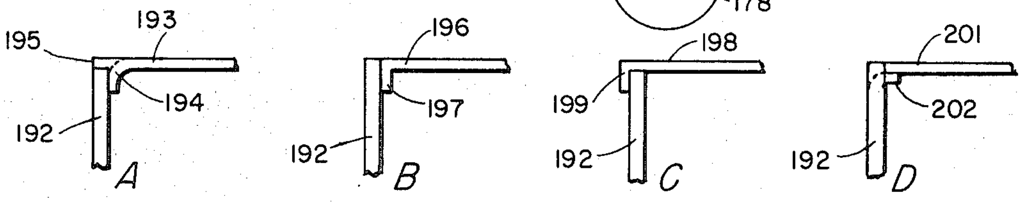
FIG. 13 is a plan view of modifications of top and side constructions according to the invention.

Referring to FIG. 13, there are shown various alternatives for attachment of covers to the sidewalls in accordance with the teachings of this invention. Thus in FIG. 13A the sidewall 192 is shown, and the top cover 193 is shown attached thereto. The top cover 193 includes a downwardly extending tab 194 but the cover itself includes a lip 195 which lies on top of the wall 192. In FIG. 13B the cover comprises a member 196 having a fold 197 which extends inside of the wall 192. In FIG. 13C, the cover 198 includes a fold wall 199 which is exterior of the vertical wall 192. In FIG. 13D the cover 201 is flush with the upper edge of the sidewall 192 but a tab 202 extends inwardly from the wall 192 for supporting the cover.

Figure 14:
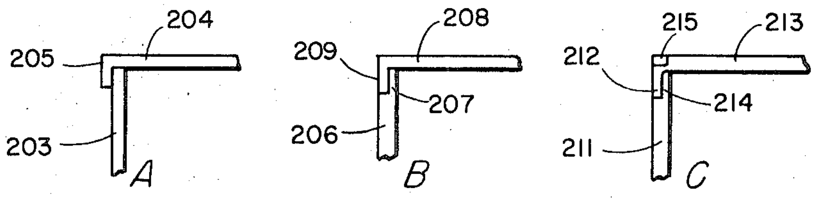
FIG. 14 is a further plan view of corner constructions according to the invention.

In FIG. 14, variations of corner constructions are shown. Thus in FIG. 14A one sidewall 203 is joined to another sidewall 204 by means of a tab 205.

In FIG. 14B, the sidewall 206 has one end 207 half etched and the sidewall 208 has its end 209 half etched. The half etched portion 209 is bent over and cooperates with the half etched portion 207 to form a flush corner for the two sidewalls 206 and 208. In FIG. 14C the sidewall 211 has a slot near one end through which a tab 212 of the other sidewall 213 may extend. The sidewall 211 has a portion 214 of its end half etched and the tab 212 is also half etched so that the half etched portions 212 and 214 cooperate to form a flush joint. The sidewall 213 and the sidewall 211 are arranged relative to each other so that the outer surface of sidewall 213 is flush with the end 215 of the sidewall 211.

It will be evident from a consideration of the preceding Figures that the technique described has great versatility in that the assemblyman can, by hand, at the time of assembling, form from thin material a shielding structure which has any desired configuration and forms shielded compartments or modules. R.F. components are on one side of the circuit boards and the circuit connections are on the other, and the leads can extend from the interior of the shielded compartments to the exterior. It will be evident that the shielding may be done with very thin material and at great economies in cost and material and avoids the expensive construction whereby compartments are hogged out of solid pieces of metal for example.

What is claimed is:

1. Means for shielding high frequency circuit components comprising:

an insulating board having circuit components mounted on one side thereof;

connections to said circuit components on the other side of said insulating board;

a sheet metal strip forming sides surrounding said circuit board;

said sheet metal strip having side edges and inwardly extending mounting tabs on the surfaces of said strip between said side edges;

said insulating board being held by said mounting tabs;

the space between the connection side of said circuit board and the edge of said sheet metal strip adjacent thereto defining on access chamber for said connections;

the space between the circuit component side of said circuit board and the edge of said sheet metal strip adjacent thereto defining an access chamber for said components;

a sheet metal bottom member conforming to contour of said sheet metal strip surrounding said circuit board and being attachable to the metal strip adjacent to said connection side;

a sheet metal top member conforming to the contour of said sheet metal strip adjacent to said component side; and means for achieving removable metal-to-metal contact between said top and bottom members and the adjacent edges of said metal strip.

2. The shielding means according to claim 1 wherein said connection access chamber is filled with a visco-elastic foam tape.

3. The shielding means according to claim 1 wherein said insulating board comprises a printed circuit board having an insulating substrate and printed film circuit connectors on the connection side thereof.

4. The shielding means according to claim 1 wherein said metal-to-metal contact means includes cooperating metal tabs on said top and bottom members and the adjacent edges of said metal strip.

5. The shielding means according to claim 4 wherein said metal-to-metal contact means comprises solder joints.

6. The shielding means according to claim 4 wherein said metal-to-metal contact means comprises metallic tape and metallic adhesive.

7. The shielding means according to claim 1 wherein said component access chamber is filled with encapsulating foam.

8. The shielding means according to claim 7 wherein said encapsulating foam comprises syntactic foam.

9. The shielding means according to claim 1 wherein the inside surfaces of either of said top and bottom sheet metal members includes an attached insulating coating.

10. The shielding means according to claim 9 wherein said insulating coating comprises an insulating tape.

11. Means for shielding one or more R.F. circuit modules from each other comprising:

a printed circuit board for each circuit module comprising a series of circuit components which require no shielding from each other at the frequency of use;

all of said circuit components being mounted on the insulating side of said printed circuit board;

printed film circuit connections to said components on the other side of said printed circuit board;

sheet metal strip means forming sides surrounding each of said circuit modules;

said sheet metal strip means having side edges and inwardly extending mounting tabs on the surfaces of said strip means between said side edges;

said printed circuit boards being held by said mounting tabs;

the spaces between the connection side of said printed circuit boards and the edges of said sheet metal strip means adjacent thereto defining access chambers for the connections of the components of each module;

the spaces between the circuit component sides of said printed circuit boards and the edges of said sheet metal strip means adjacent thereto defining access chambers for the components of each module;

a sheet metal bottom member conforming to the contour of the sheet metal strips surrounding each of said modules and being attachable to the metal strip adjacent to the connection side of the particular one of said modules;

a sheet metal top member conforming to the contour of the sheet metal strips surrounding each of said modules and being attachable to the metal strip adjacent to the component side of the particular one of said modules; and means for achieving removable metal-to-metal contact between said top and bottom members and the adjacent edges of said metal strips.

12. The means for shielding according to claim 11 wherein the sheet metal strips surrounding each module are formed by chemical milling.

* * * * *